| (12) United States Patent | (10) Patent No.: US 8,279,099 B2 |
| Zare-Hoseini | (45) Date of Patent: Oct. 2, 2012 |

(54) DELTA-SIGMA ANALOGUE-TO-DIGITAL CONVERTERS

(75) Inventor: Hashem Zare-Hoseini, Cambridge (GB)

(73) Assignee: Cambridge Silicon Radio Limited, Cambridge, Cambridgeshire (GB)

( * ) Notice: Subject to any disclaimer, the term of this patent is extended or adjusted under 35 U.S.C. 154(b) by 75 days.

(21) Appl. No.: 12/836,078

(22) Filed: Jul. 14, 2010

(65) Prior Publication Data

US 2011/0012768 A1    Jan. 20, 2011

(30) Foreign Application Priority Data

Jul. 16, 2009  (GB) .................................. 0912372.0

(51) Int. Cl.
*H03M 3/00* (2006.01)

(52) U.S. Cl. ...................................... 341/143; 341/155

(58) Field of Classification Search .................. 341/143, 341/155

See application file for complete search history.

(56) References Cited

U.S. PATENT DOCUMENTS

| 6,538,588 B1 * | 3/2003 | Bazarjani | 341/143 |
| 7,375,666 B2 * | 5/2008 | Melanson | 341/143 |
| 7,423,567 B2 * | 9/2008 | Melanson | 341/143 |
| 2008/0062022 A1 * | 3/2008 | Melanson | 341/143 |

* cited by examiner

*Primary Examiner* — Jean B Jeanglaude

(74) *Attorney, Agent, or Firm* — Mark J. Danielson; Pillsbury Winthrop Shaw Pittman LLP

(57) ABSTRACT

An integrator based on an amplifier having a capacitive element connected between the input and the output of the amplifier, with a resistive element connected in series with the capacitive element. Integrators of this type can be used in feed-forward structures of delta-sigma analogue-to-digital converters in order to avoid the need for adders to combine the outputs of parallel signal paths in the feed-forward structure.

14 Claims, 5 Drawing Sheets

DELTA-SIGMA ANALOGUE-TO-DIGITAL CONVERTERS

FIELD

The invention relates to the conversion of electrical signals from the analogue domain to the digital domain. Specifically, the invention relates to delta-sigma analogue to digital converters (ADCs).

BACKGROUND

Delta-sigma ADCs are often used in high resolution applications because, compared to other ADC implementations, the need for complex anti-aliasing filters is reduced, differential non-linearity errors are reduced and they are more robust. By trading accuracy for speed, delta-sigma ADCs allow high performance to be achieved with high tolerance to analogue component imperfections. Delta-sigma ADCs are often seen as the best choice for low to moderate frequency, high resolution applications.

In terms of implementation, continuous time (CT) delta-sigma ADCs are often preferred over their switched capacitor (SC) counterparts due to their lower power consumption, lower need for anti-aliasing filtering and their ability to operate at higher speeds.

From the point of view of topology, single-loop delta-sigma ADCs can be realised using feed-forward, feed-back or hybrid structures.

FIG. 1 illustrates schematically the topology of a feed-forward delta-sigma ADC. The feed-forward delta-sigma ADC 10 converts an analogue signal U into a digital signal Y. The ADC 10 comprises three adders 12, 14 and 16, three integrators 18, 20 and 22, four amplifiers 24, 26, 28 and 30, a quantiser 32 and a digital to analogue converter (DAC) 34. In practice, the amplifiers 24, 26, 28, 30 are typically implemented as part of the other blocks, as are adders 12 and 14. The nature of this structure will be understood by engineers skilled in the art of ADC design and therefore will not be discussed here in depth. The adder 16 combines the outputs of the three integrators 18, 20 and 22 as scaled by the gains of their respective amplifiers 24, 26 and 28. Hence the "feed-forward" label for this ADC topology.

FIG. 2 illustrates schematically the topology for a feed-back delta-sigma ADC topology. The feed-back delta-sigma ADC 36 is arranged to convert an analogue signal U into a digital signal Y. The feed-back delta-sigma ADC 36 comprises three adders 38, 40 and 42, three integrators 44, 46 and 48, four amplifiers 50, 52, 54 and 56, a quantiser 58 and a DAC 60. The digital output Y is converted to the analogue domain by the DAC 60 and is subtracted from the inputs to each of the integrators 44, 46 and 48 with appropriate scaling being done by the amplifiers 50, 52 and 54. Hence the "feed-back" label.

FIG. 3 illustrates schematically the topology of a hybrid delta-sigma ADC. The hybrid delta-sigma ADC 62 converts an analogue signal U into a digital signal Y. The ADC 62 comprises three adders 64, 66 and 68, three integrators 70, 72 and 74, four amplifiers 76, 78, 80 and 82, a quantiser 84 and a DAC 86. In ADC 62, the output of integrator 72 is fed forward via amplifier 80 to adder 68. Thus, the hybrid delta-sigma ADC 62 includes part of the feed-forward topology of ADC 10 of FIG. 1. In ADC 62, the digital output signal Y is converted to the analogue domain by DAC 86 and is subtracted from the output signal of integrator 70. Therefore, ADC 62 includes a part of the feed-back topology of ADC 36 of FIG. 2. Hence the "hybrid" label for the ADC topology shown in FIG. 3.

As just discussed, there are common elements to the ADC topologies shown in FIGS. 1 and 3. That is to say, ADCs 10 and 62 include respective feed-forward structures 88 and 90, in which there is a chain of integrators whose outputs all feed forward into an adder. In the case of feed-forward structure 88, there are three integrators 18, 20 and 22 in the chain, whereas in feed-forward structure 90, there are just two integrators 72 and 74 in the chain.

SUMMARY

According to one aspect, a feed-forward structure for a delta-sigma ADC, the structure comprising at least one modified integrator, wherein the or each modified integrator includes a resistive element connected in series with a capacitive element that is connected between an input and an output of an amplifying means within the modified integrator.

According to another aspect, the invention provides a feed-forward structure for a delta-sigma ADC, the structure comprising at least one modified integrator that comprises amplifying means with an input and an output and a capacitive element connected between the input and the output and also a resistive element connected between the input and the output and in series with the capacitive element.

The use of modified integrators permits feed-forward structures to be designed that omit the adder that sums the contributions that are fed forward from the integrators within the feed-forward structure. The ability to omit this adder from a delta-sigma ADC topology is very significant since the space and electrical power that would otherwise be consumed by the adder can both be saved.

Typically, the capacitive element within a modified integrator is a single capacitor but it might also be constructed from a group of capacitors. Likewise, the resistive element within a modified integrator is typically a single resistor but it might also be implemented from a group of resistors. Instead of using a resistor (resistors), a transistor (or transistors) operating in its (their) in linear region could be used.

In certain embodiments, the modified integrators operate on differential input signals.

In certain embodiments, the feed-forward structure comprises an integrator chain comprising a series of integrators of which all except one of them is a modified integrator.

The invention also extends to a delta-sigma ADC including a feed-forward structure according to the invention. Similarly, the invention also extends to a silicon chip in which is integrated a feed-forward structure according to the invention.

According to another aspect, the invention provides a delta-sigma ADC for digitising a first analogue signal, the delta-sigma ADC comprising comparator means, an integrator chain, quantising means and converting means, wherein the quantising means is arranged to emit a digital signal representing the first analogue signal, the converting means is arranged to convert the digital signal into a second analogue signal, the comparator means is arranged to produce a difference signal representing the difference between the first and second analogue signals, the integrator chain is arranged to condition the difference signal en route to the quantiser, the integrator chain comprises a series of integrators, all but the final integrator in the chain is a modified integrator, and the or each modified integrator has a capacitive element connected between an input and an output and a resistor in series with that capacitive element.

By using an integrator chain of this type, it is possible to dispense with the adder that would normally sum the feed-forward contributions from the integrators in the chain. As was mentioned earlier, the omission of this adder can lead to a more space and power efficient design.

A delta-sigma ADC according to the invention may, in certain embodiments, be a feed-forward delta-sigma ADC.

A delta-sigma ADC according to the invention may, in certain embodiments be a hybrid delta-sigma ADC.

A delta-sigma ADC according to the invention may be implemented in silicon as part of an integrated circuit containing additional functionality, for example a Bluetooth transceiver and an FM radio receiver.

BRIEF DESCRIPTION OF THE DRAWINGS

By way of example only, certain embodiments of the invention will now be described with reference to the accompanying figures in which.

DETAILED DESCRIPTION

Figure 1:
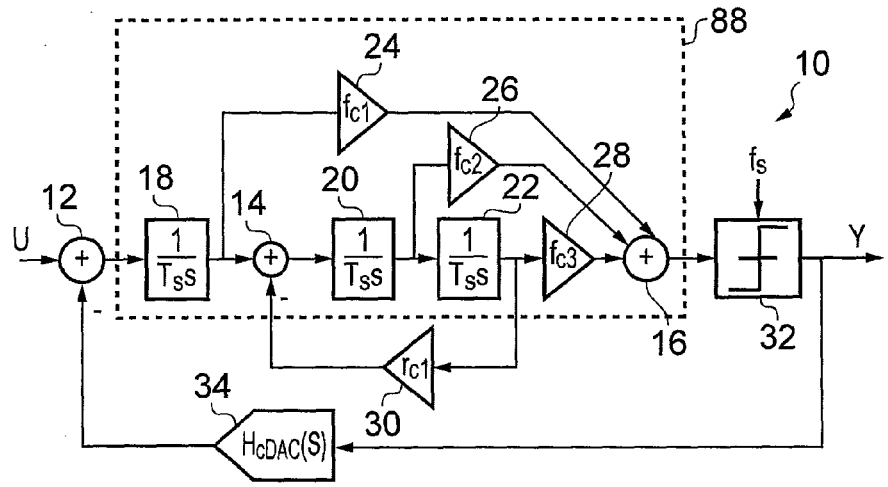
FIG. 1 illustrates schematically the topology of a feed-forward delta-sigma ADC.
Figure 2:
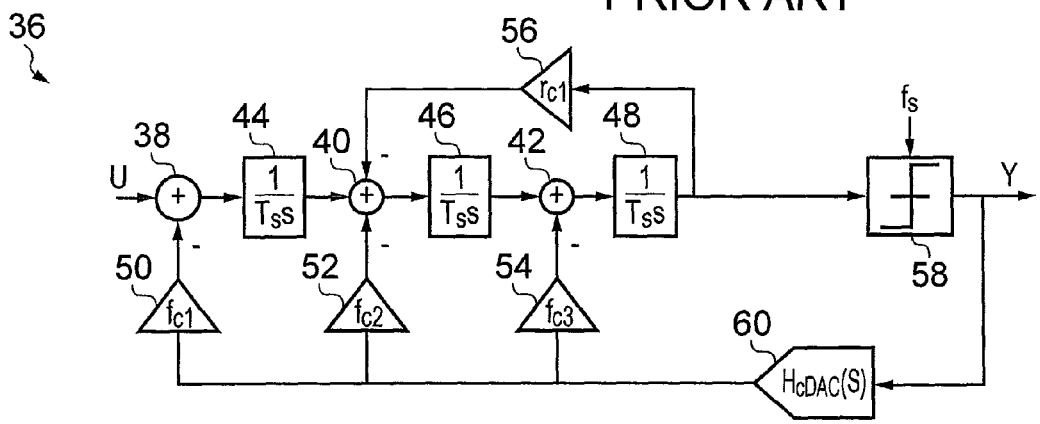
FIG. 2 illustrates schematically the topology of a feed-back delta-sigma ADC.
Figure 3:
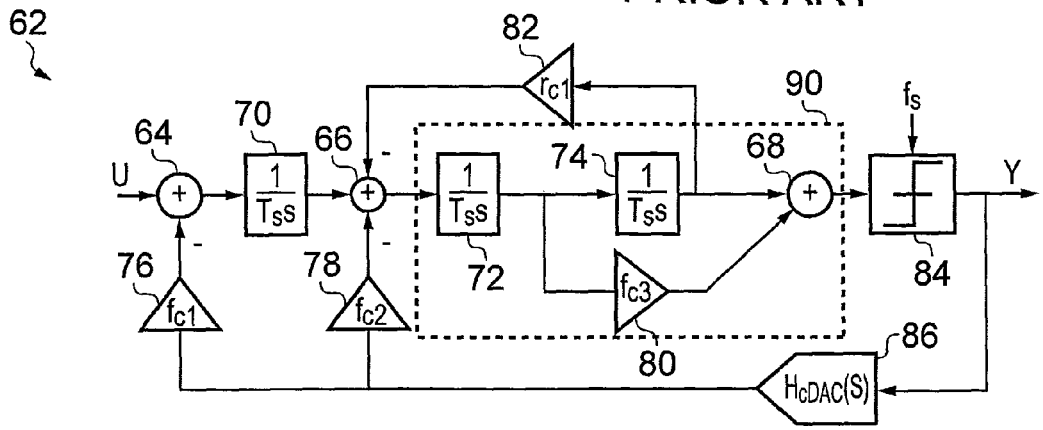
FIG. 3 illustrates schematically the topology of a hybrid delta-sigma ADC.
Figure 4:
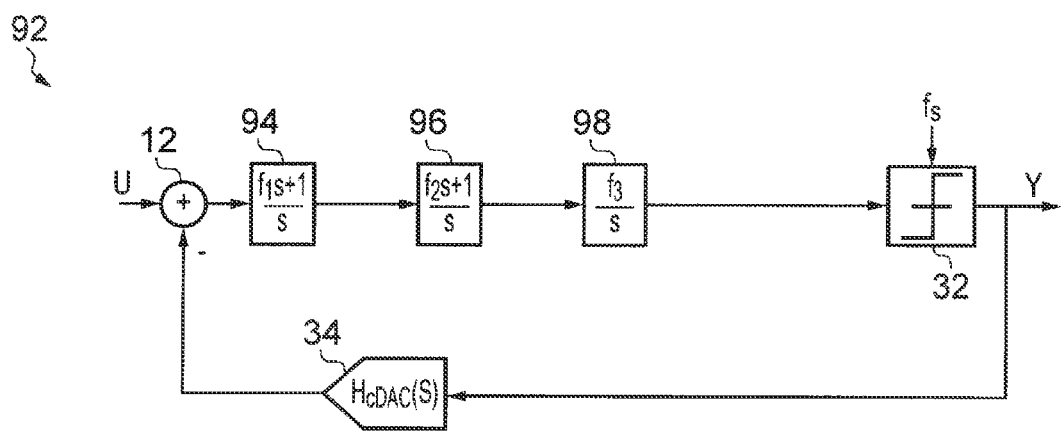
FIG. 4 illustrates schematically a topology for a feed-forward delta-sigma ADC with a modified feed-forward structure, without a resonator for the sake of simplicity.

FIG. 4 shows a delta-sigma ADC 92 that is a modified version of the feed-forward delta-sigma ADC 10 of FIG. 1. Elements that have been carried over from FIG. 1 to FIG. 4 retain the same reference numerals. For the sake of simplicity, the resonator of ADC 10 is omitted in FIG. 4. In essence, ADC 92 differs from ADC 10 in that the feed-forward structure 88 has been replaced by a chain of three elements in series. These elements are two modified integrators 94 and 96 and a normal integrator 98. By using this chain, it is possible to dispense with the adder 16 of feed-forward structure 88 that is required for summing the feed-forward contributions from the integrators 18, 20 and 22 in FIG. 1. Therefore, a Single-Path delta-sigma ADC is achieved.

The transfer function of normal integrator 98 is well known and is:

$$\frac{f_3}{s}$$

where $f_3$ is a constant and s is the Laplace variable.

The modified integrators 94 and 96, however, have a different transfer function of the form:

$$\frac{f_s + 1}{s}$$

where f is a constant ($f_1$ in the case of modified integrator 94 and $f_2$ in the case of modified integrator 96) and s is again the Laplace variable.

The ADC 10 can be regarded as having a transfer function of $T_1$ between the output of subtracting adder 12 and the input of the quantiser 32. Likewise, the ADC 92 can be regarded as having a transfer function of $T_2$ between the output of subtracting adder 12 and the quantiser 32. The coefficients $f_1$, $f_2$ and $f_3$ in ADC 92 can be adjusted so that $T_1 \sim T_2$, as will now be explained.

For the sake of simplicity, we can, in the following calculations, omit the resonator constituted by feedback amplifier 30, as was done for the purpose of clarifying FIG. 4. In calculating T1, the transfer functions of amplifiers 24, 26 and 28 are $f_{c1}$, $f_{c2}$ and $f_{c3}$, respectively, and each of the integrators 18, 20 and 22 has a transfer function of 1/s, Therefore, we arrive at the result:

$$T_1 = \frac{f_{c1}}{s} + \frac{f_{c2}}{s^2} + \frac{f_{c3}}{s^3}$$

For ADC 92, we have:

$$T_2 = \left(\frac{f_1 s + 1}{s}\right) \cdot \left(\frac{f_2 s + 1}{s}\right) \cdot \left(\frac{f_3}{s}\right).$$

This reduces to:

$$T_2 = \frac{f_1 f_2 f_3}{s} + \frac{(f_1 + f_2)f_3}{s^2} + \frac{f_3}{s^3}.$$

To achieve $T_1 = T_2$, we can equate the $$\frac{1}{s}$$

terms in the $T_1$ and $T_2$ equations above, and do likewise for the $$\frac{1}{s^2} \text{ and } \frac{1}{s^3}$$

terms. This gives the following set of simultaneous equations:

$$f_{c1} = f_1 f_2 f_3 \quad \left(\text{from the } \frac{1}{s} \text{ terms}\right)$$

$$f_{c2} = (f_1 + f_2)f_3 \quad \left(\text{from the } \frac{1}{s^2} \text{ terms}\right)$$

$$f_{c3} = f_3 \quad \left(\text{from the } \frac{1}{s^3} \text{ terms}\right)$$

The simultaneous equations can be solved to yield values for $f_1$, $f_2$ and $f_3$ that give $T_1=T_2$. These values can the be implemented in the design of ADC 92 so that ADC 92 offers substantially the same filtering, in terms of selecting a wanted signal and in terms of antialiasing, as is provided by ADC 10. Moreover, ADC 92 achieves this identity of filtering whilst allowing adder 16 to be omitted thereby making space and power consumption savings relative to ADC 10.

Figure 5:
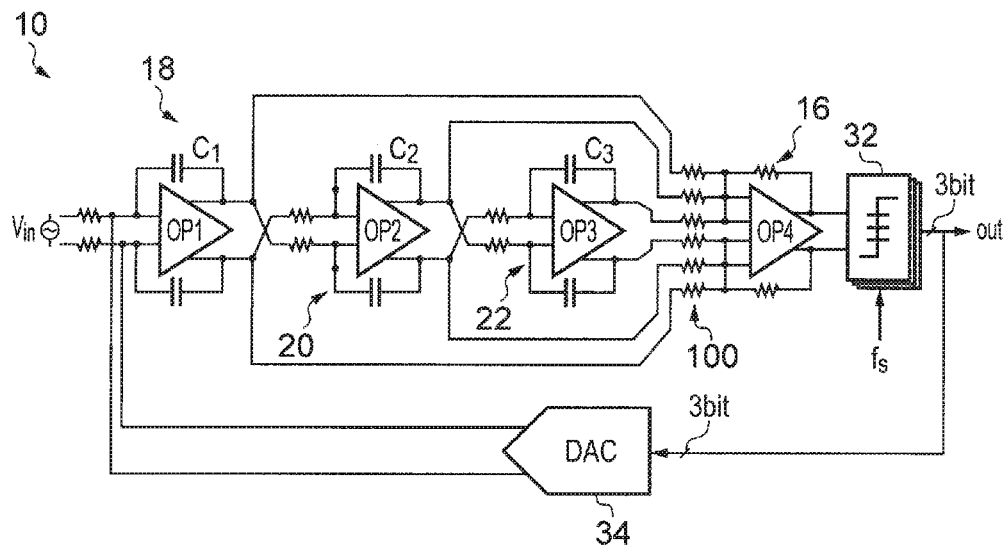
FIG. 5 illustrates a circuit implementation for the topology of FIG. 1 without its resonator for the sake of simplicity.
Figure 6:
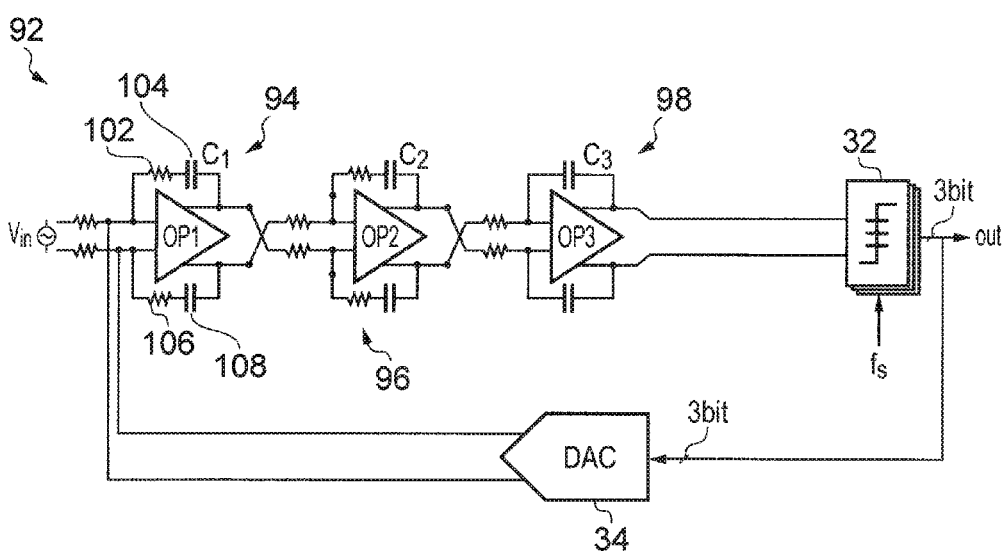
FIG. 6 illustrates a circuit implementation for the topology of FIG. 4.

The saving in circuit elements that is obtained by using the modified integrators will now emphasised by discussing the circuit implementations shown in FIGS. 5 and 6.

FIG. 5 shows a circuit implementation of the ADC 10 of FIG. 1. Reference signs carried over from FIG. 1 to FIG. 5 denote the same elements as before. Each of the integrators 18, 20 and 22 has a conventional design comprising a differential Op Amp with a capacitor leading from each input to the corresponding output. For example, integrator 18 is provided by Op Amp OP1 with two capacitors of capacitance $C_1$ connected from its inputs to its outputs. Adder 16 is indicated in FIG. 5 and its main constituent is Op Amp OP4. The amplifiers 24, 26 and 28 of FIG. 1 are implemented by the row of resistors indicated 100 in FIG. 5.

FIG. 6 shows a circuit implementation of the Single-Path ADC 92 using the modified integrators. Reference signs carried over from FIG. 4 to FIG. 6 denote the same reference numerals as before. By looking at FIG. 6, it is plain that normal integrator 98 has the same structure as integrators 18, 20 and 22 in FIG. 5. It is also clear from FIG. 6 that the modified integrators 94 and 96 each differ in structure from the conventional structure that is used for integrator 98 in that resistors are placed in series with the capacitors extending from the inputs to the outputs of the Op Amps in modified integrators 94 to 96. For example, in modified integrator 94, a resistor 102 is placed in series with capacitor 104 that connects one of the inputs of Op Amp OP1 with the corresponding output of that amplifier and a resistor 106 is placed in series with capacitor 108 that connects the other input of the Op Amp OP1 with the respective output of that amplifier. By adding these resistors in series with the capacitors that extend around the Op Amps of the modified integrators 94 and 96, the modified integrators are given transfer functions of the desired form:

$$\frac{f_s+1}{s}$$

It will be apparent that the circuit of the Single-Path ADC 92 can be implemented in a smaller area than the circuit of ADC 10 since the circuit of ADC 92 as illustrated in FIG. 6 does not include the adder 16 (based on Op Amp OP4) and the set of resistors 100.

Figure 7:
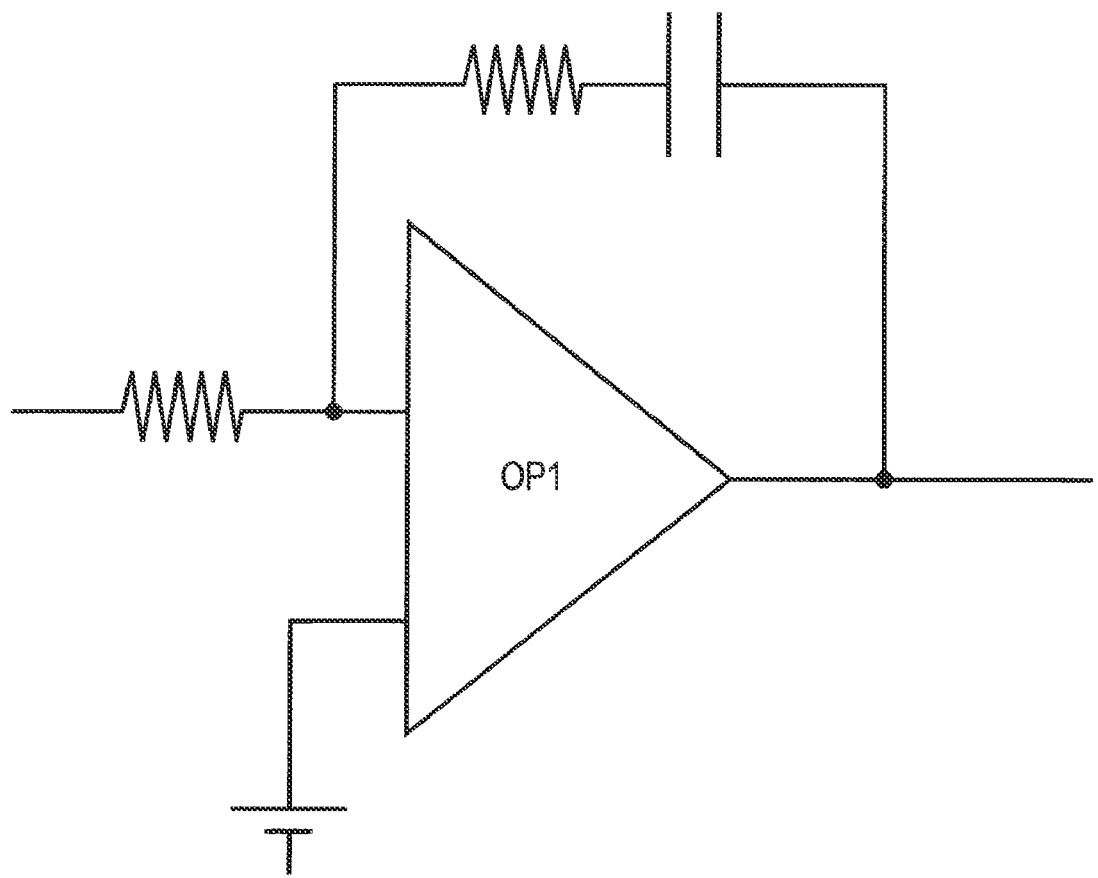
FIG. 7 illustrates a single ended signal implementation of a modified integrator, as opposed to differential signal implementation.

In the circuit implementations of FIGS. 5 and 6, the Op Amps use differential signals, which are sometimes called dual ended signals. Of course, analogous circuit implementations could be constructed using single ended signals. In such implementations, one of the mirror image sets of elements above and below the Op Amps would be omitted. For example, a single ended version of modified integrator 94 would be as illustrated in FIG. 7.

Figure 8:
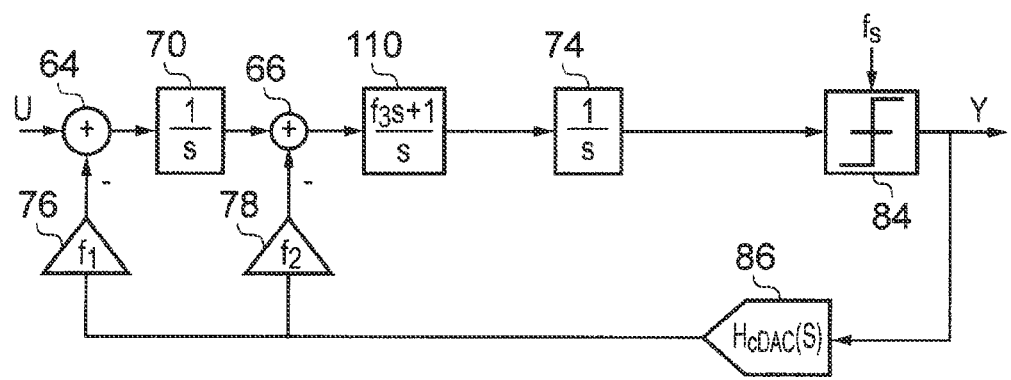
FIG. 8 illustrates schematically a topology for a hybrid delta-sigma ADC using a modified feed-forward structure.

FIGS. 4 to 7 have been used to explain in detail the use of modified integrators in a feed-forward structure within a feed-forward delta-sigma ADC in order to eliminate the adder responsible for combining feed-forward contributions. However, modified integrators can also be used within a feed-forward structure in a hybrid delta-sigma ADC to achieve the same result. FIG. 8 illustrates an example of this and illustrates the use of a modified integrator 110 in place of integrator 72 and the feed-forward path through amplifier 18 in the hybrid delta-sigma ADC 62 in FIG. 3. In FIG. 8, reference signs carried over from FIG. 3 denote the same elements as before.

In the example shown in FIG. 4, a chain of two modified integrators leading into a normal integrator is used to replace a feed-forward structure having three integrators whose outputs are fed forward to an adder. In the example given in FIG. 8, a modified integrator feeds into a normal integrator in a substitute for a feed-forward structure in which the outputs of two integrators feed-forward into an adder. In general terms, a feed-forward structure containing N integrators that feed-forward into an adder can be replaced by a chain of N-1 modified integrators feeding into an ordinary integrator in order to eliminate the adder that would sum the feed-forward contributions.

The invention claimed is:

1. A feed-forward structure for a delta-sigma analogue-to-digital converter, the structure comprising at least one modified integrator that comprises an amplifier with an input and an output and a capacitive element connected between the input and the output and also a resistive element connected between the input and the output and in series with the capacitive element.

2. The feed-forward structure according to claim 1, wherein the capacitive element of the or of at least one of the modified integrators comprises a single capacitor.

3. The feed-forward structure according to claim 1, wherein the resistive element of the or of at least one of the modified integrators comprises a single resistor.

4. A feed-forward structure for a delta-sigma analogue-to-digital converter, the structure comprising an integrator chain comprising a series of integrators of which all except one is a modified integrator having a resistive element and a capacitive element connected in series between an input and an output of an amplifier within the integrator.

5. The feed-forward structure of claim 1, wherein the feed-forward structure is included in a delta-sigma analogue-to-digital converter operating as a feed-forward delta-sigma analogue-to-digital converter.

6. A delta-sigma analogue-to-digital converter for digitizing a first analogue signal, the delta-sigma analogue-to-digital converter comprising:
  a) a comparator,
  b) a feed-forward structure comprising an integrator chain that includes a series of integrators,
  c) a quantiser arranged to emit a digital signal representing the first analogue signal, and
  d) a converter arranged to convert the digital signal into a second analogue signal,
  wherein
  the comparator is arranged to produce a difference signal representing the difference between the first and second analogue signals,
  the integrator chain is arranged to condition the difference signal en route to the quantiser,
  all except one of the integrators in the chain is a modified integrator, and
  each modified integrator has a capacitive element connected between its input and its output and a resistor in series with that capacitive element.

7. The delta-sigma analogue-to-digital converter according to claim 6, wherein the delta-sigma analogue-to-digital converter operates as a feed-forward delta-sigma analogue-to-digital converter.

8. A The delta-sigma analogue-to-digital converter according to claim 6, wherein the delta-sigma analogue-to-digital converter operates as a hybrid feed-back feed-forward delta-sigma analogue-to-digital converter.

9. The feed-forward structure of claim 1, wherein the feed-forward structure is integrated in a silicon chip.

10. A The delta-sigma analogue-to-digital converter according to claim 6, wherein the delta-sigma analogue-to-digital converter is integrated in a silicon chip.

11. The feed-forward structure of claim 1, wherein the feed-forward structure is included in a delta-sigma analogue-to-digital converter operating as a hybrid feed-back feed-forward delta-sigma analogue-to-digital converter.

12. The feed-forward structure of claim 4, wherein the feed-forward structure is included in a delta-sigma analogue-to-digital converter operating as a feed-forward delta-sigma analogue-to-digital converter.

13. The feed-forward structure of claim 4, wherein the feed-forward structure is included in a delta-sigma analogue-to-digital converter operating as a hybrid feed-back feed-forward delta-sigma analogue-to-digital converter.

14. The feed-forward structure of claim 4, wherein the feed-forward structure is integrated in a silicon chip.

\* \* \* \* \*

UNITED STATES PATENT AND TRADEMARK OFFICE
CERTIFICATE OF CORRECTION

PATENT NO. : 8,279,099 B2
APPLICATION NO. : 12/836078
DATED : October 2, 2012
INVENTOR(S) : Zare-Hoseini It is certified that error appears in the above-identified patent and that said Letters Patent is hereby corrected as shown below:

In Column 4, Line 17, delete "$T_1 \sim T_2$," and insert -- $T_1 \approx T_2$, --, therefor.

In Column 4, Line 24, delete "1/s," and insert -- 1/s. --, therefor.

In Column 7, Line 1, in Claim 8, delete "A The" and insert -- The --, therefor.

In Column 7, Line 7, in Claim 10, delete "A The" and insert -- The --, therefor.

Signed and Sealed this
Nineteenth Day of March, 2013

Teresa Stanek Rea
*Acting Director of the United States Patent and Trademark Office*